US011640969B2

(12) United States Patent
Hosaka et al.

(10) Patent No.: US 11,640,969 B2
(45) Date of Patent: May 2, 2023

(54) COMPENSATION CAPACITORS LAYOUT IN SEMICONDUCTOR DEVICE

(71) Applicant: Micron Technology, Inc., Boise, ID (US)

(72) Inventors: Hiroki Hosaka, Kanagawa (JP); Satoru Sugimoto, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/191,273

(22) Filed: Mar. 3, 2021

(65) Prior Publication Data

US 2022/0285478 A1 Sep. 8, 2022

(51) Int. Cl.

*H01L 49/02* (2006.01)
*H01L 27/108* (2006.01)
*G11C 11/401* (2006.01)

(52) U.S. Cl.

CPC ............ *H01L 28/60* (2013.01); *H01L 27/108* (2013.01); *G11C 11/401* (2013.01)

(58) Field of Classification Search

CPC ..... H01L 23/5223; H01L 28/40; H01L 28/60; H01L 27/108; H01L 27/10805; H01L 27/10808

See application file for complete search history.

(56) References Cited

U.S. PATENT DOCUMENTS

2010/0046138 A1* 2/2010 Do .......................... H01L 28/60 29/25.42
2012/0056298 A1* 3/2012 Kuroki ................ H01L 23/5223 257/532
2013/0242643 A1* 9/2013 Kim ........................ H01L 28/90 365/149
2015/0145011 A1* 5/2015 Nakamura ........ H01L 27/10894 257/306
2020/0058580 A1* 2/2020 Lin ..................... H01L 23/5223

* cited by examiner

*Primary Examiner* — John A Bodnar
(74) *Attorney, Agent, or Firm* — Dorsey & Whitney LLP

(57) ABSTRACT

Apparatuses and methods for arranging compensation capacitors are described. An example apparatus includes: a first conductive layer including a portion; a second conductive layer: a contact coupled to the portion of the first conductive layer; a third conductive layer between the first conductive layer and the second conductive layer, coupled to the contact; one or more capacitor elements wherein each capacitor element of the one or more capacitor elements includes one end coupled to the second conductive layer and another end coupled to the third conductive layer.

18 Claims, 10 Drawing Sheets

40
43A
43
42A
42B
44A
Power
GND
41A
42'A
41B
44B
42'B
42''A
43B
401
402

70
Power
GND
71'
72B
72'B
73
72'''A
72''B
71B
71B
71B
72''B
702
701
74'
71A
74
72A
71A
71A
73
71A
71B
72''A

COMPENSATION CAPACITORS LAYOUT IN SEMICONDUCTOR DEVICE

BACKGROUND

High data reliability, high speed of memory access, reduced chip size and reduced power consumption are features that are demanded from semiconductor memory. Due to reduced power supply voltage and a reduced chip size, noise to a power supply can negatively impact performance. Compensation capacitors included in the device have been used to stabilize the power supply. A semiconductor memory device, such as a DRAM (Dynamic Random Access Memory) for instance, includes a memory cell array having memory cells. The semiconductor memory device may include compensation capacitors in a peripheral circuit region outside the memory cell array that have similar structures as memory cells.

The compensation capacitors included in the peripheral circuit region may include a capacitive unit of two or more capacitors in a series. Since a voltage of each capacitor having a structure similar to a memory cell is less than a voltage difference between power supply voltages (e.g., VDD and VSS), a voltage through the capacitive unit of the two or more capacitors may match the voltage difference between the power supply voltages. The capacitive unit of two or more compensation capacitors in series may be included in unused space in logic circuit blocks in the peripheral circuit region. However, spaces in the logic circuit blocks in the peripheral circuit region that are less than an area for the two or more capacitors of the capacitive unit may be left unused. In order to efficiently use space in logic circuit blocks in the peripheral circuit region, a more flexible structure for compensation capacitors included in the peripheral circuit region may be desired.

DETAILED DESCRIPTION

Certain details are set forth below to provide a sufficient understanding of examples of various embodiments of the disclosure. However, it will be clear to one having skill in the art that examples described herein may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring embodiments of the disclosure. Additionally, terms such as "couples" and "coupled" mean that two components may be directly or indirectly electrically coupled. Indirectly coupled may imply that two components are coupled through one or more intermediate components.

Figure 1:
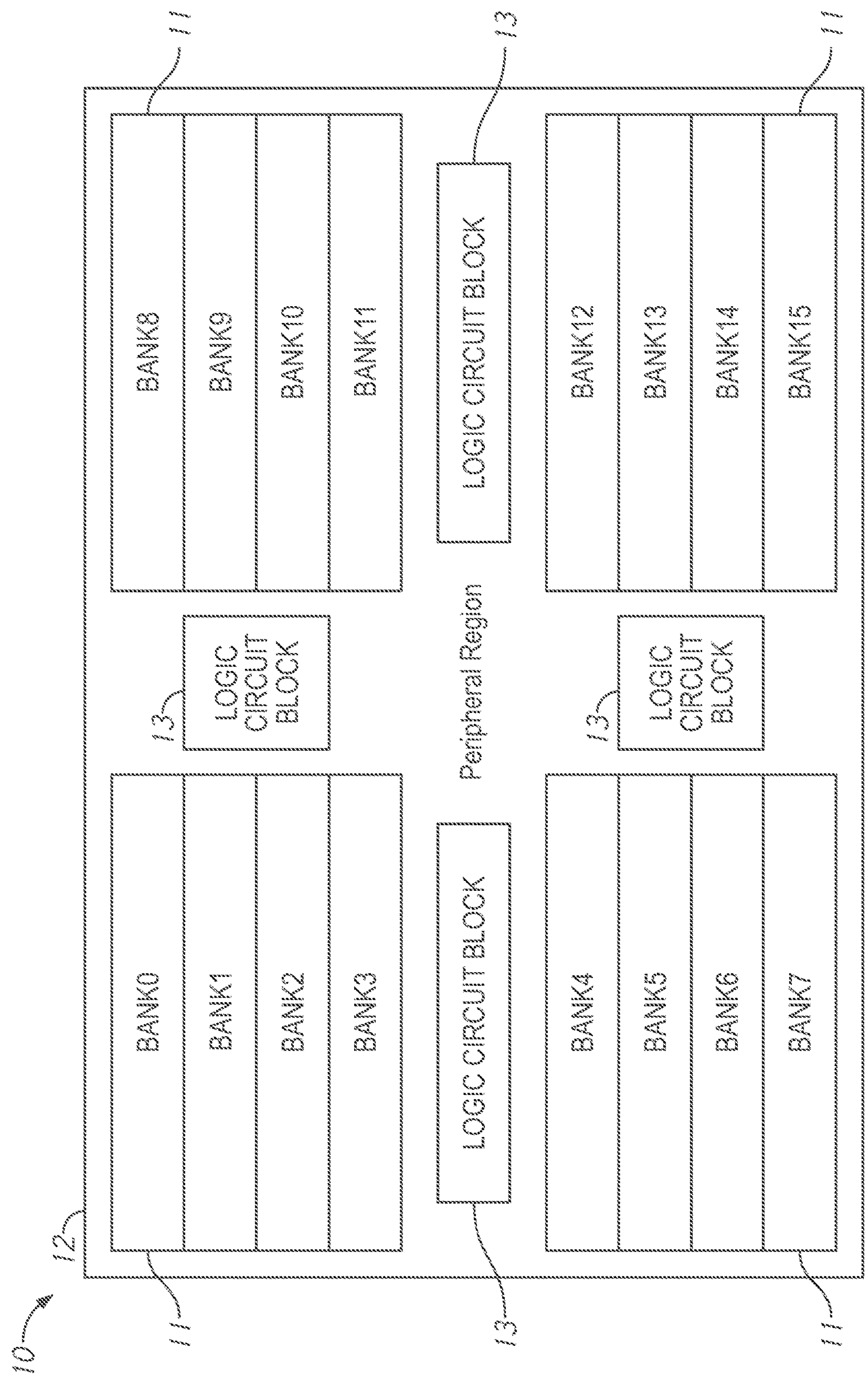
FIG. 1 is a diagram for a layout of a semiconductor device according to an embodiment of the disclosure.

FIG. 1 is a diagram for an example layout of a semiconductor device 10 according to an embodiment of the disclosure. In some embodiments of the disclosure, the semiconductor device 10 may include a memory cell array 11 and a peripheral region 12. The memory cell array 11 may be divided into sixteen banks BK0 to BK15. In the peripheral circuit region 12, various peripheral circuits and external terminals may be disposed (not shown). For example, a row decoder circuit (not shown) may be disposed between adjacent banks and/or in the peripheral circuit region 12. An input/output (DQ) circuit may be disposed in the peripheral circuit region 12. The peripheral circuit region 12 may include logic circuit blocks 13. The logic circuit blocks 13 may include compensation capacitors (not shown).

Figure 2:
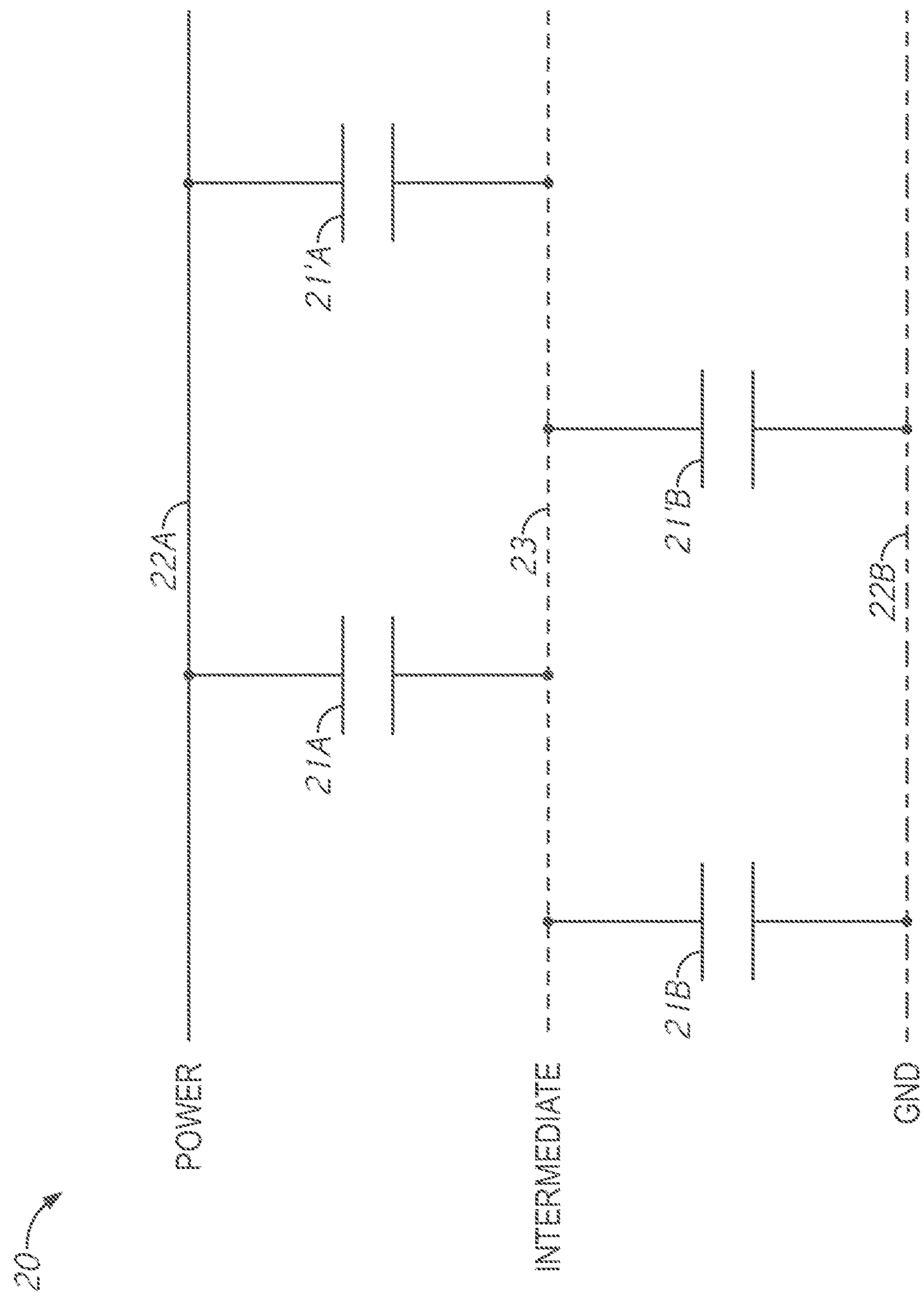
FIG. 2 is a circuit diagram of a portion of a semiconductor device including capacitors according to an embodiment of the disclosure.

FIG. 2 is a circuit diagram of a portion 20 of a semiconductor device including a pair of capacitors 21A and 21B and another pair of capacitors 21'A and 21'B according to an embodiment of the disclosure. In some embodiments, the capacitors 21 may be disposed in one or more logic circuit blocks 13 in FIG. 1. Each of the capacitors 21A and 21'A has a node coupled to a power supply node 22A and another node coupled to an intermediate node 23. Each of the capacitors 21B and 21'B has one node coupled to a power supply node 22B and another node coupled to the intermediate node 23. In some embodiments, the power supply node 22A may provide a positive power supply voltage VDD. In some embodiments, the power supply node 22B may provide aground voltage GND or a negative power supply voltage VSS. In some embodiments, the intermediate node 23 may provide an intermediate voltage. For example, in some embodiments of the disclosure, the intermediate node 23 may provide a voltage that is an average of voltages of power supply nodes 22A and 22B.

Figure 3:
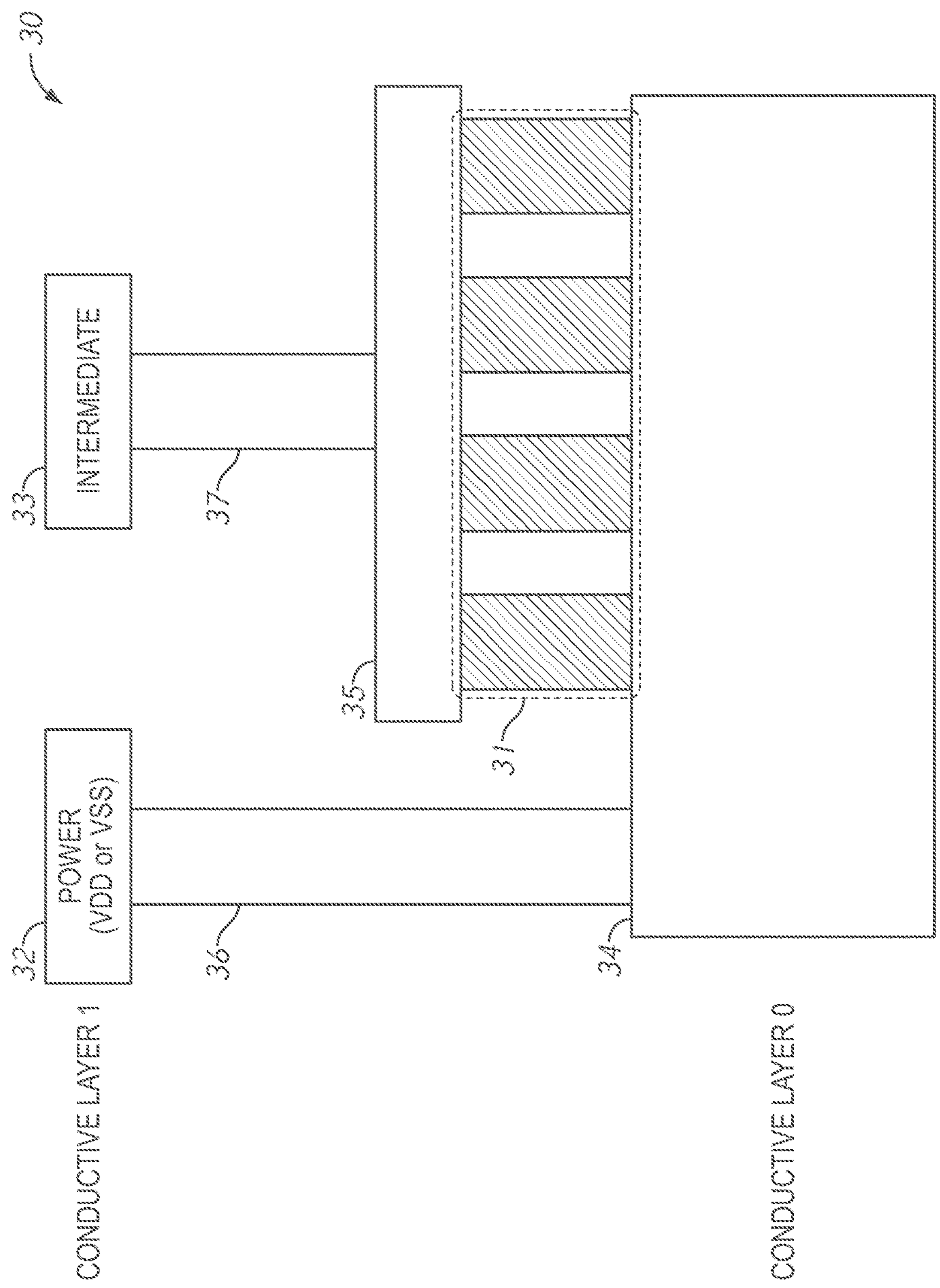
FIG. 3 is a diagram of a capacitor in a semiconductor device according to an embodiment of the disclosure.

FIG. 3 is a diagram of a capacitor 30 in a semiconductor device according to an embodiment of the disclosure. In some embodiments, one or more of the capacitors 21A, 21'A, 21B and 21'B in FIG. 2 may include the capacitor 30.

The capacitor 30 may include capacitor elements 31 coupled in parallel. Each of the capacitor elements 31 may have an end coupled to a conductive layer 34 (e.g., Conductive Layer 0) and another end coupled to an intermediate layer 35. In some embodiments, each of the capacitor elements 31 may have a pillar shape. In some embodiments, each of the capacitor elements 31 may have a cylinder shape. In some embodiments, the conductive layer 34 may be a metal-0 layer including one or more conductive materials. The capacitor 30 may include a contact 36 that is coupled to the conductive layer 34 and a power portion 32. In some embodiments the conductive layer 34 may be coupled to the contact 36. The power portion 32 may be included in another conductive layer (e.g., Conductive Layer 1). The power portion 32 may provide a power supply voltage (e.g., VDD, a ground voltage or VSS). Thus, the power portion 32, the contact 36 and the conductive layer 34 may be included in a power node, such as the power supply node 22A or the power node 22B.

The intermediate layer 35 coupled to the other ends of the capacitor elements 31 may include conductive material, such as polycrystalline silicon. The capacitor 30 may include a contact 37 that is coupled to the intermediate layer 35 and to an intermediate portion 33 of the other conductive layer (e.g., Conductive Layer 1). The intermediate layer 35 may be coupled to the contact 37. The intermediate portion 33 may be included in the conductive layer (e.g., Conductive Layer 1) including one or more conductive materials. For example, Conductive Layer may be a metal-1 layer. The intermediate layer 35 may be disposed between the conductive layer 34 (e.g., Conductive Layer 0) and the conductive layer including the power node 32 and the intermediate node 33 (e.g., Conductive Layer 1). Thus, the intermediate portion 33, the contact 37 and the conductive layer 35 may be included in an intermediate node, such as the intermediate node 23. The intermediate portion 33 may have a voltage that is different from the power supply voltage of the power portion 32. The contacts 36 and 37 may include conductive material. The contacts 36 and 37 may be contact plugs or conductive vias. In some embodiments, the contacts 36 and 37 may be formed concurrently. In some embodiments, the contacts 36 and 37 may be formed separately.

Figure 4:
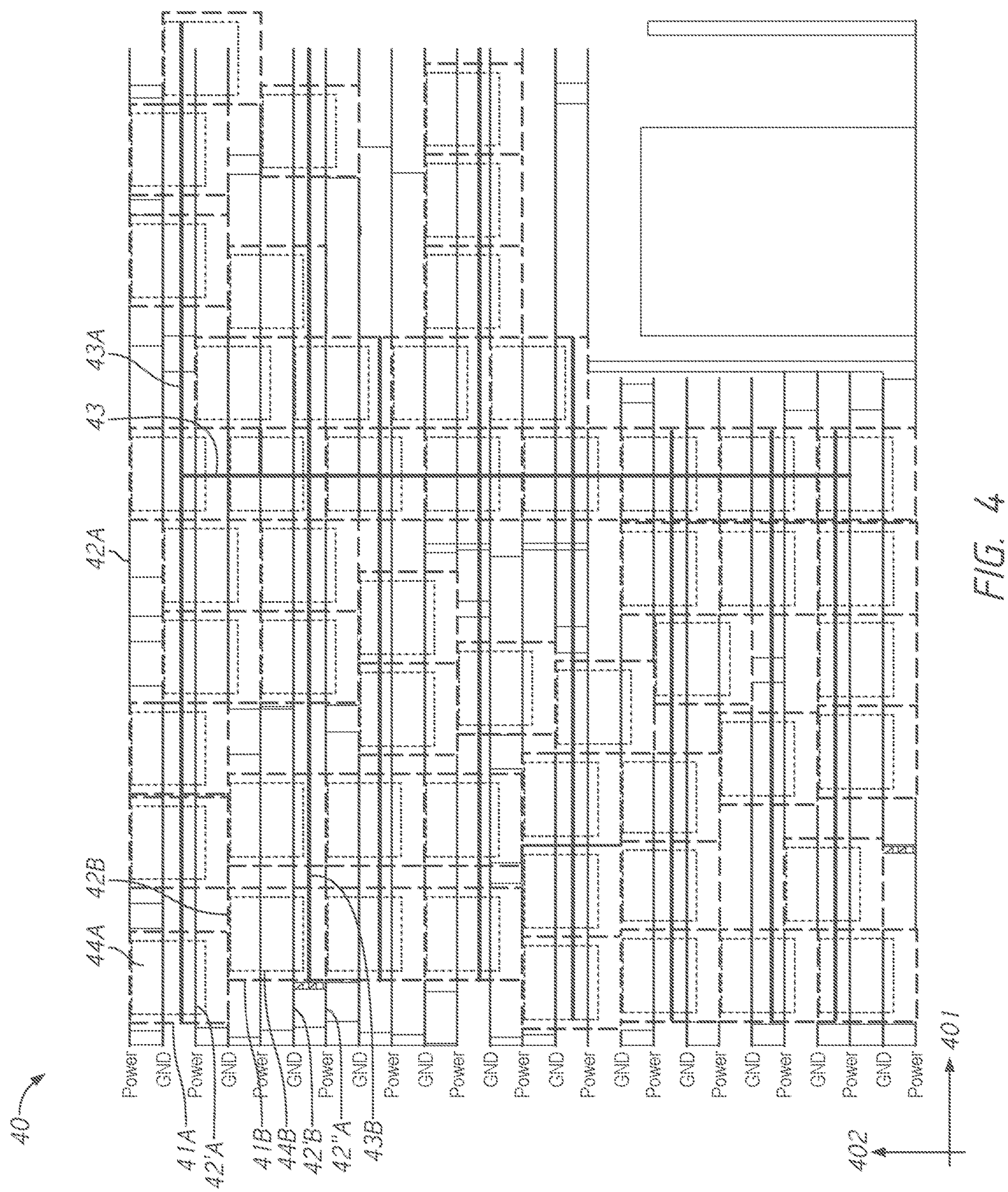
FIG. 4 is a diagram for a layout of a logic circuit block including capacitors in a semiconductor device according to an embodiment of the disclosure.

FIG. 4 is a diagram for a layout of a logic circuit block 40 including capacitors 41A and 41B in a semiconductor device according to an embodiment of the disclosure. The layout is a plan view from a direction perpendicular to each layer of conductive layers and an intermediate layer included in the logic circuit block 40. In some embodiments, the logic circuit block 40 may be one of the logic circuit blocks 13 of FIG. 1. The logic circuit block 40 may include conductive layers, such as Conductive Layer 0 and Conductive Layer 1 in FIG. 3 extending in a first direction 401 and a second direction 402 perpendicular to the first direction 401. One of the conductive layers, such as the Conductive Layer 1 of FIG. 3 may include several power supply lines extending in parallel in the first direction 401. In some embodiments, the power supply lines may be disposed in parallel with equal interval defined by a distance between the power supply lines in the second direction 402. In some embodiments, a logic row may be defined by two power supply lines spaced apart by the interval. In some embodiments, unlike a series of capacitors which may requires more rows to be disposed, each capacitor may be disposed across a few rows, such as three rows in the example of FIG. 4. Thus, each capacitor may be disposed in a relatively small area available. The power supply lines may include several types of power supply lines extending alternately in parallel in the first direction 401. The power supply lines of a first type, including power supply lines 42A, 42'A and 42"A, may provide a power supply voltage (e.g., VDD). The power supply lines 42A, 42'A and 42"A may be the power supply node 22A in FIG. 2, or the power supply node 32 included in Conductive Layer 1 in FIG. 3. The power supply lines of a second type, including power supply lines 42B and 42'B may provide a ground voltage (GND). The power supply lines 42B and 42'B may be the power supply node 22B in FIG. 2, or the power supply node 32 included in Conductive Layer 1 in FIG. 3. The logic circuit block 40 may include a plurality of capacitors, including capacitors 41A and 41B. In some embodiments, the capacitors 41A may include the capacitors 21A and 21'A in FIG. 2 and the capacitors 41B may include the capacitors 21B and 21'B in FIG. 2. In some embodiments, each of the capacitors 41A and 41B may be the capacitor 30 in FIG. 3. In some embodiments, a number of capacitors 41A and a number of capacitors 41B may be the same. In some embodiments, a capacitance of each of the capacitors 41A and 41B may be given a constant amount (the same).

Each of the capacitors 41A may include one side towards a top of FIG. 4 and another side opposite to the one side towards a bottom of FIG. 4. Each of the capacitors 41A may be disposed between a power supply line (e.g., the power supply line 42A) that provides a power supply voltage (e.g., VDD) adjacent to or in proximity to the one side of the capacitor 41A and another power supply line (e.g., a power supply line 42B) that provides a ground voltage (GND) adjacent to or in proximity to the other side of the capacitor 41A, when viewed from the direction perpendicular to the directions 401 and 402. The capacitor 41A may include another conductive layer 44A. For example, the conductive layer 44A may be the conductive layer 34 (e.g., Conductive Layer 0) of FIG. 3 extending in parallel to the conductive layer (e.g., Conductive Layer 1) including the power supply lines. The conductive layer 44A may have one side towards the top of FIG. 4 and another side opposite to the one side towards the bottom of FIG. 4. In some embodiments, the one side and the other side of the conductive layer 44A may extend in the first direction 401. The conductive layer 44A may be coupled to the power supply line 42A that is above and in proximity to the one side of the conductive layer 44A. The conductive layer 44A may also be coupled to the power supply line 42'A that is above and in proximity to the other side of the conductive layer 44A. Thus, the capacitor 41A may receive a power supply voltage (e.g., VDD) from the power supply lines 42A and 42'A.

Each of tire capacitors 41B may include one side towards a top of FIG. 4 and another side opposite to the one side towards a bottom of FIG. 4. Each of the capacitors 41A may be disposed between a power supply line (e.g., the power supply line 42B) that provides the ground voltage (GND) adjacent to or in proximity to the one side of the capacitor 41B and another power supply line (e.g., the power supply line 42"A) that provides a power supply voltage (e.g., VDD) adjacent to or in proximity to the other side of the capacitor 41B, when viewed from the direction perpendicular to the directions 401 and 402. The capacitor 41B may include another conductive layer 44B. For example, the conductive layer 44B may be the conductive layer 34 (e.g., Conductive Layer 0) of FIG. 3 extending in parallel to the conductive layer (e.g., Conductive Layer 1) including the power supply lines. The conductive layer 44B may have one side towards the top of FIG. 4 and another side opposite to the one side towards the bottom of FIG. 4. In some embodiments, the one side and the other side of the conductive layer 44B may extend in the first direction 401. The conductive layer 44B may be coupled to the power supply line 42B that is above and in proximity to the one side of the conductive layer 44B. The conductive layer 44B may also be coupled to the power supply line 42'B that is above and in proximity to the other side of the conductive layer 44B. Thus, the capacitor 41B may receive a ground voltage (GND) from the power supply lines 42B and 42'B.

The capacitor 41A may be coupled to an intermediate line 43A that is coupled to an intermediate line 43. In some embodiments, the intermediate line 43A may be the intermediate node 23 of FIG. 2. The intermediate line 43A may be included in the same conductive layer with the power supply lines 42A and 42'A. The intermediate line 43A may have a voltage that is different from a voltage of the power supply lines 42A and 42'A. The capacitor 41B may be coupled to an intermediate line 43B that is coupled to the intermediate line 43. In some embodiments, the intermediate line 43B may be the intermediate node 23 of FIG. 2. The intermediate line 43B may be included in the same conductive layer with the power supply lines 42B and 42'B. The intermediate line 43B may have a voltage that is different from a voltage of the power supply lines 42B and 42'B. In some embodiments, a voltage of the intermediate line 43 may be the average of the voltages on the power supply lines 42A and 42B, (e.g., VDD/2). Because the intermediate line 43 may couple any of the capacitors 41A to any of the capacitors 41B, each pair of the capacitors 41A and 41B may be disposed apart from each other. Bach pair of the capacitors 41A and 41B does not require one area (e.g., an area of five rows) which is capable to accommodate the pair of the capacitors 41A and 41B together. Instead, the pair of the capacitors 41A and 41B may be separately disposed at separate areas of three rows away from each other. Thus, the intermediate line 43 may provide a freedom to dispose the capacitors 41 at relatively small areas, either together or apart, in a flexible manner.

Figure 5:
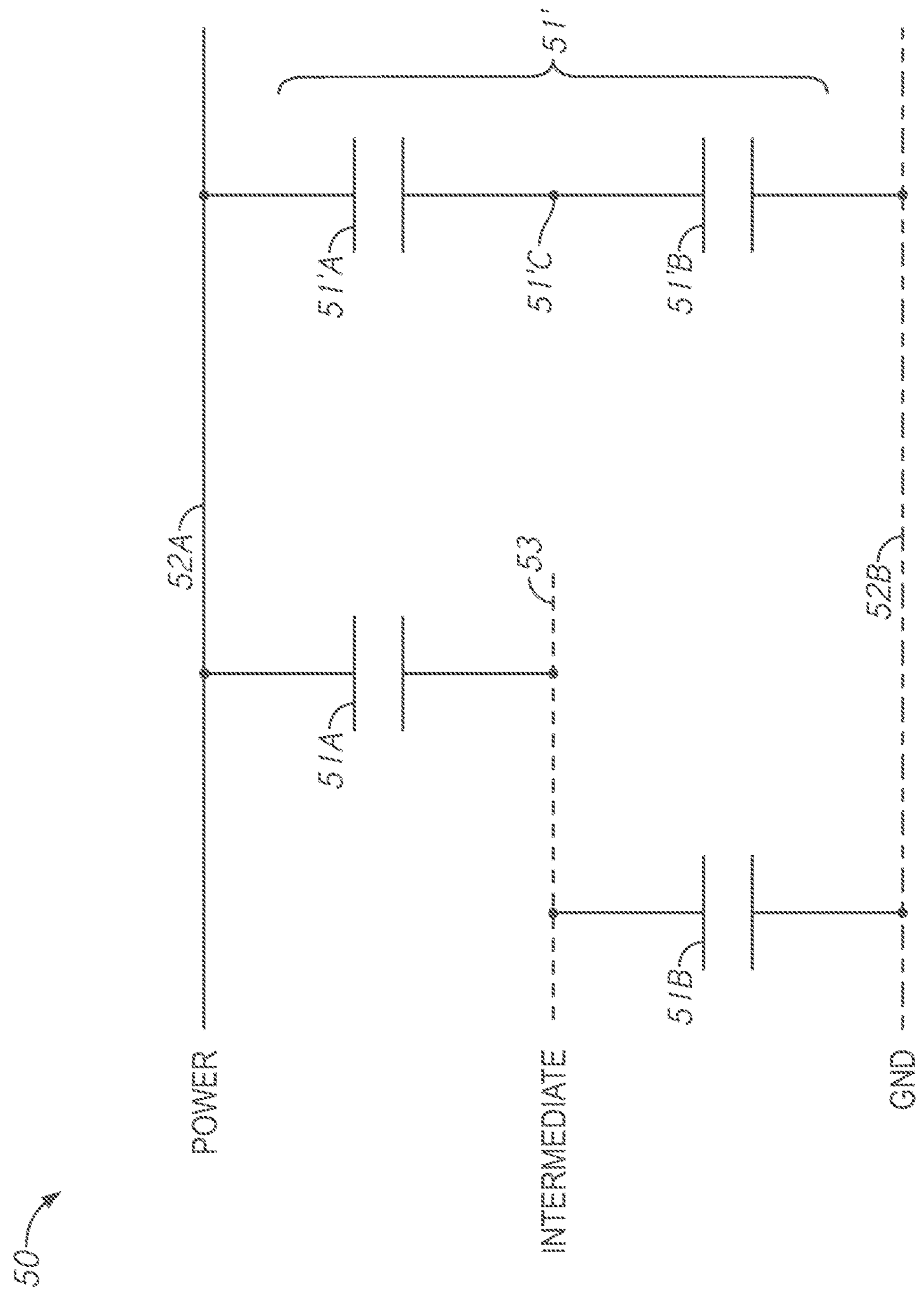
FIG. 5 is a circuit diagram of a portion of a semiconductor device including capacitors according to an embodiment of the disclosure.

FIG. 5 is a circuit diagram of a portion 50 of a semiconductor device including a pair of capacitors 51A and 51B and another pair of capacitors 51'A and 51'B according to an embodiment of the disclosure. In some embodiments, the capacitors 51 may be disposed in one or more logic circuit blocks 13 in FIG. 1. The capacitor 51A has a node coupled to a power supply node 52A and another node coupled to an intermediate node 53. The capacitor 51B has a node coupled to a power supply node 52B and another node coupled to the intermediate node 53. The capacitor 51'A has one node coupled to the power supply node 52A and another node coupled to a node 51'C. The capacitor 51'B has one node coupled to the power supply node 52B and another node coupled to the node 51'C. Thus, the capacitors 51'A and 51'B may be coupled in series between the power supply nodes 52A and 52B. In some embodiments, the power supply node 52A may provide a positive power supply voltage VDD. In some embodiments, the power supply node 52B may provide a ground voltage GND or a negative power supply voltage VSS. In some embodiments, the intermediate node 53 may provide an intermediate voltage. For example, in some embodiments of the disclosure, the intermediate node 23 may provide a voltage that is an average of voltages of power supply nodes 52A and 52B.

Figure 6A:
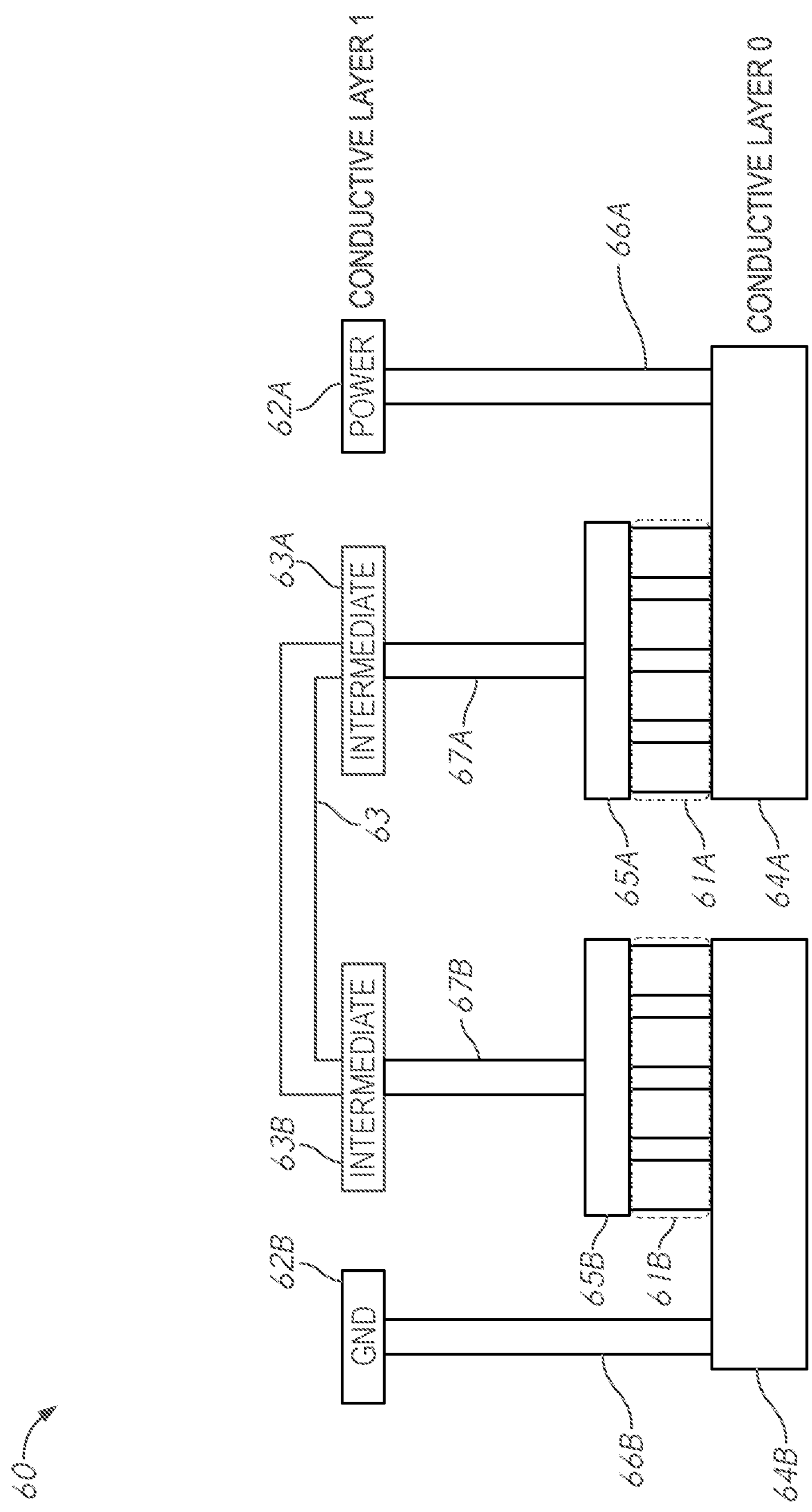
FIG. 6A is a diagram of a portion of a semiconductor device including capacitor elements according to an embodiment of the disclosure.

FIG. 6A is a diagram of a portion 60 of a semiconductor device including capacitor elements 61A and 61B according to an embodiment of the disclosure. In some embodiments, the portion 60 may be included in the portion 50 of FIG. 5. In some embodiments, each of the capacitors 51A and 51B in FIG. 5 may include a plurality of corresponding capacitor elements 61A and 61B respectively. In some embodiments, each of the capacitor elements 61A and 61B may have a pillar shape. In some embodiments, each of the capacitor elements 61A and 61B may have a cylinder shape.

The capacitor elements 61A may be coupled in parallel, having an end coupled to a conductive layer 64A (e.g., Conductive Layer 0) and another end coupled to an intermediate layer 65A. In some embodiments, a contact 66A may be coupled to the conductive layer 64A and to a power portion 62A of another conductive layer (e.g., Conductive Layer 1). The power portion 62A may provide a power supply voltage (e.g., VDD). In some embodiments, the power portion 62A, the contact 66A and the conductive layer 64A may be included in a power node, such as the power supply node 52A.

The intermediate layer 65A may be coupled to the other ends of the capacitor elements 61A. The intermediate layer 65A may be coupled to a contact 67A. The contact 67A may be coupled to an intermediate portion 63A. The intermediate portion 63A may be included in the conductive layer (e.g., Conductive Layer 1). The intermediate portion 63A may have a voltage that is different from the power supply voltage of the power portion 62A.

The capacitor elements 61B may be coupled in parallel, having an end coupled to a conductive layer 64B (e.g., Conductive Layer 0) and another end coupled to an intermediate layer 65B. In some embodiments, a contact 66B may have an end coupled to the conductive layer 64B and another end coupled to another power portion 62B of another conductive layer (e.g., Conductive layer 1). The power portion 62B may provide a power supply voltage (e.g., a ground voltage GND or VSS). In some embodiments, the power portion 62B, the contact 66B and the conductive layer 64B may be included in another power node, such as the power supply node 52B.

The intermediate layer 65B may be coupled to the other ends of the capacitor elements 61B. The intermediate layer 65B may be coupled to a contact 67B. The contact 67B may be coupled to an intermediate portion 63B. The intermediate portion 63B may be included in the conductive layer (e.g., Conductive Layer 1). The intermediate portion 63B may have a voltage that is different from the power supply voltage of the power portion 62B. The intermediation portions 63A and 63B may be coupled to a common intermediate line 63. The common intermediate line 63 may be included in the conductive layer (e.g., Conductive Layer 1).

Figure 6B:
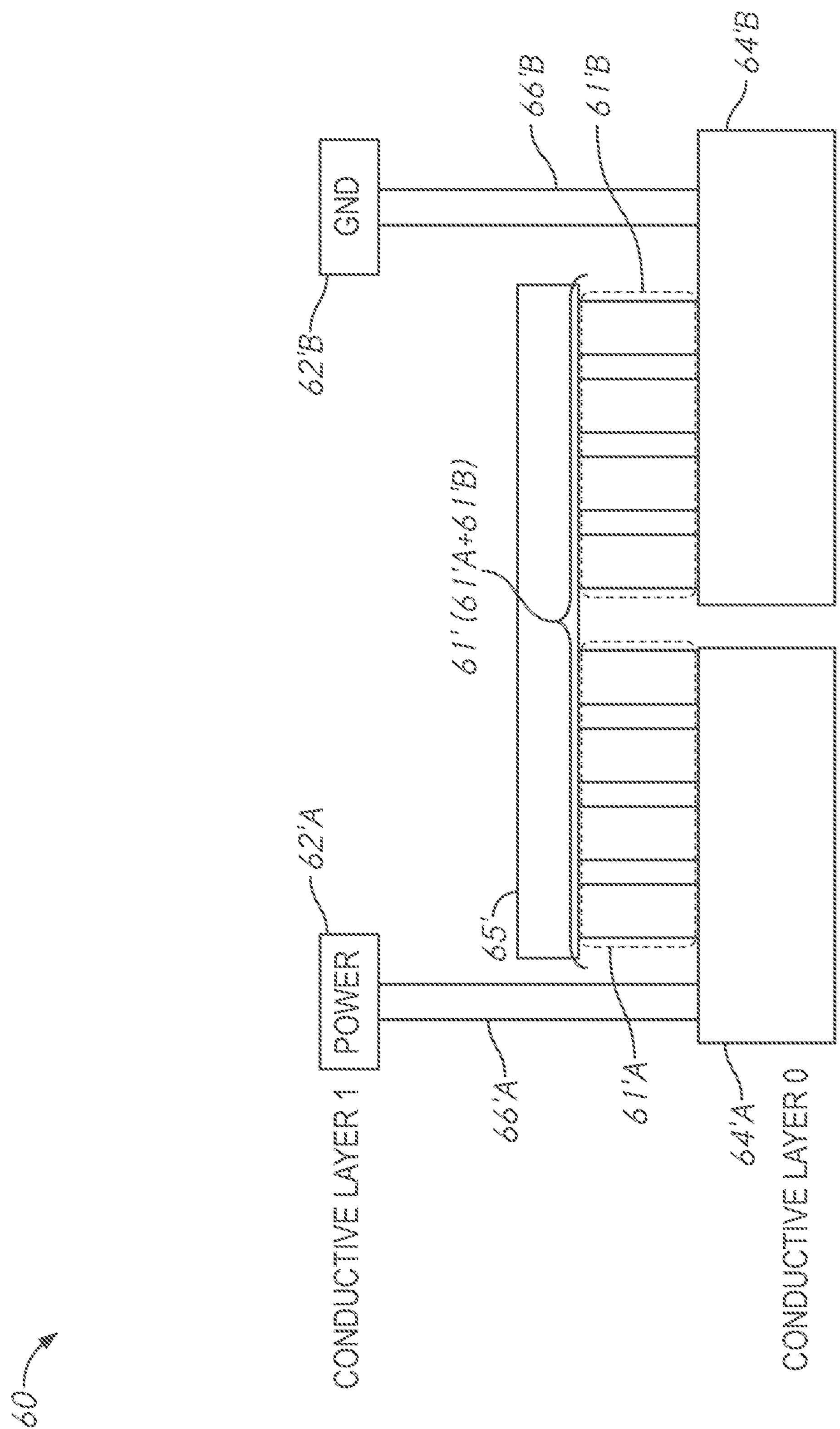
FIG. 6B is a diagram of a portion of a semiconductor device including capacitor elements according to an embodiment of the disclosure.

FIG. 6B is a diagram of a portion 60' of a semiconductor device including capacitor elements 61'A and 61'B according to an embodiment of the disclosure. In some embodiments, the portion 60' may be included in the portion 50 of FIG. 5. In some embodiments, each of the capacitors 51'A and 51'B in FIG. 5 may include a plurality of corresponding capacitor elements 61'A and 61'B respectively. In some embodiments, each of the capacitor elements 61'A and 61'B may have a pillar shape. In some embodiments, each of the capacitor elements 61'A and 6'B may have a cylinder shape.

The portion 60' may include a pair of capacitors 61' that includes the capacitor elements 61'A and 61'B that are coupled in series via an intermediate layer 65'. In some embodiments, the intermediate layer 65' may be included in the node 51'C of FIG. 5. The capacitor elements 61'A may be coupled in parallel, having an end coupled to a conductive layer 64'A (e.g., Conductive Layer 0) and another end coupled to the intermediate layer 65'. In some embodiments the conductive layer 64'A may be coupled to a power portion 62'A of another conductive layer (e.g., Conductive layer 1) through a contact 66'A. The power portion 62'A may provide a power supply voltage (e.g., VDD). In some embodiments, the power portions 62A and 62'A may be coupled to a power supply line that provides the power supply voltage (e.g., VDD). In some embodiments, the power portions 62A and 62'A may be coupled to separate power supply lines that provide the power supply voltage (e.g., VDD).

The capacitor elements 61'B may be coupled in parallel, having an end coupled to a conductive layer 64'B (e.g., Conductive Layer 0) and another end coupled to the intermediate layer 65' that is coupled to the capacitor elements 61'A. In some embodiments the conductive layer 64'B may be coupled to a power portion 62'B included in another conductive layer (e.g., Conductive Layer 1) through a contact 66'B. The power portion 62'B may provide a power supply voltage (e.g., ground voltage GND or VSS). In some embodiments, the power portions 62B and 62'B may be coupled to a power supply line that provides the power supply voltage (e.g., ground voltage GND or VSS). In some embodiments, the power portions 62B and 62'B may be coupled to separate power supply lines that provide the power supply voltage (e.g., ground voltage GND or VSS).

In some embodiments, the intermediate layers 65A, 65B may be disposed in a layer between the conductive layers 64A, 64B in Conductive Layer 0 and the intermediate portions 63A and 63B in Conductive Layer 1 respectively. In some embodiments, the intermediate layer 65' may be disposed between Conductive Layer 0 including the conductive layers 64'A. 64'B and Conductive Layer 1 including the power portions 63A and 63B. In some embodiments, Conductive Layer 0 including the conductive layers 64A, 64B, 64'A and 64' B may include one or more conductive materials. For example. Conductive Layer 0 may be a metal-0 layer. In some embodiments, Conductive Layer 1 including the intermediate portions 63A and 63B and the common intermediate line 63 and the power nodes 62A, 62B, 62'A and 62'B may include one or more conductive materials. For example. Conductive Layer 1 may be a metal-1 layer. In some embodiments, the intermediate layers 65A, 65B and 65' may include conductive material, such as polycrystalline silicon. The contacts 66A, 66B, 67A, 67B, 66'A and 66'B may include conductive material. The contacts 66A, 66B, 67A, 67B, 66'A and 66'B may be contact plugs or conductive vias. In some embodiments, the contacts 66A, 66B, 67A, 67B, 66'A and 66'B may be formed concurrently. In some embodiments, the contacts 66A, 66B, 67A, 67B, 66'A and 66'B may be formed separately.

Figure 7:
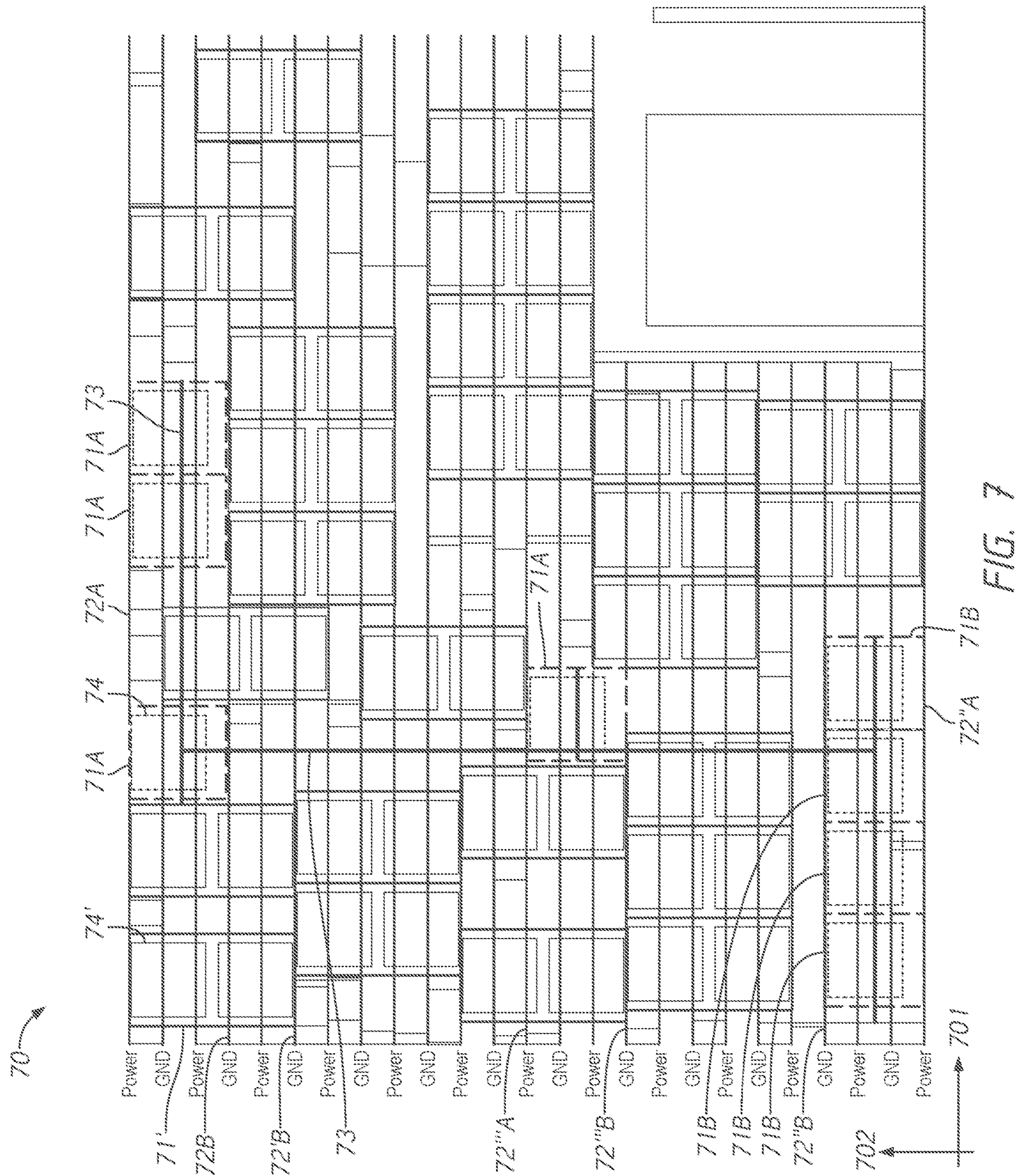
FIG. 7 is a diagram for a layout of a logic circuit block including capacitors in a semiconductor device according to an embodiment of the disclosure.

FIG. 7 is a diagram for a layout of a logic circuit block 70 including capacitors 71A, 71B and units of capacitors 71' in a semiconductor device according to an embodiment of the disclosure. The layout is viewed from a direction perpendicular to layers, such as conductive layers and an intermediate layer included in the logic circuit block 70. In some embodiments, the logic circuit block 70 may be one of the logic circuit blocks 13 of FIG. 1. The logic circuit block 70 may include conductive layers, such as Conductive Layer 0 and Conductive Layer 1 in FIG. 6, extending in a first direction 701 and a second direction 702 perpendicular to the first direction 701. One of the conductive layers, such as the Conductive Layer 1 of FIG. 6 may include several power supply lines extending in parallel in the first direction 701. In some embodiments, the power supply lines may be disposed in parallel with equal interval defined by a distance between the power supply lines in the second direction 702. In some embodiments, a logic row may be defined by two power supply lines spaced apart by the interval. In some embodiments, each capacitor of the capacitors 71A and 71B may be disposed across a few rows, such as three rows in the example of FIG. 7. Thus, each capacitor of the capacitors 71A and 71B may be disposed in a relatively small area available. In some embodiments, each of the capacitors 71A may be the capacitor 51A in FIG. 5 or the capacitor elements 61A in FIG. 6. Each of the capacitors 71B may be the capacitor 51B in FIG. 5 or the capacitor elements 61B in FIG. 6. In some embodiments, a number of capacitors 71A and a number of capacitors 71B may be the same. In some embodiments, each of the capacitors 71A and 71B may have a constant (the same) capacitance (the same).

Each pair of capacitors 71' may be disposed across several rows, such as five rows in the example of FIG. 7. Thus, each pair of capacitors 71' may be disposed in an area larger than an area where each capacitor of the capacitors 71A and 71B is disposed. Each pair of capacitors 71' may include two or more capacitors coupled in series, such as the pair of capacitors 51' in FIG. 5 or the pair of capacitors 61' in FIG. 6. The power supply lines may include several types of power supply Hues extending alternately in parallel in the first direction 701. The power supply lines of a first type, including power supply lines 72A, 72"A and 72'"A may provide a power supply voltage (e.g., VDD). The power supply lines 72A, 72"A and 72'"A may be the power supply node 52A in FIG. 5, or the power supply node 62A and/or 62'A included in Conductive Layer 1 in FIG. 6. The power supply lines of a second type, including power supply lines 72B, 72'B, 72"B and 72'"B may provide a ground voltage (GND). The power supply lines 72B, 72'B, 72"B and 72'"B may be the power supply node 52B in FIG. 5, or the power supply node 62B and/or 62'B included in Conductive Layer 1 in FIG. 6.

The capacitors 71A and the capacitors 71B may be coupled to an intermediate line 73. In some embodiments, the intermediate line 73 may be the intermediate node 53 of FIG. 5 or the common intermediate line 63 of FIG. 6. The intermediate line 73 may be included in the same conductive layer with the power supply lines 72A, 72"A, 72'"A, 72B, 72'B, 72"B and 72'"B. The intermediate line 43A is insulated from (e.g., not coupled to) the power supply lines 72A, 72"A, 72'"A, 72B, 72'B, 72"B and 72'"B. In some embodiments, a voltage of the intermediate line 73 may be the average of the voltages on the power supply lines 72A and 72B, (e.g., VDD/2). Because the intermediate line 73 may couple any of the capacitors 71A to any of the capacitors 71B, each pair of the capacitors 71A and 71B may be disposed apart from each other. Each pair of the capacitors 71A and 71B does not require one area (e.g., an area of five rows) which is capable to accommodate the pair of the capacitors 71A and 71B together. Instead, the pair of the capacitors 71A and 71B may be separately disposed at separate areas of three rows away from each other. Thus, the intermediate line 73 may provide a freedom to dispose the capacitors 71A and 71B at relatively small areas, either together or apart, in a flexible manner.

Figure 8A:
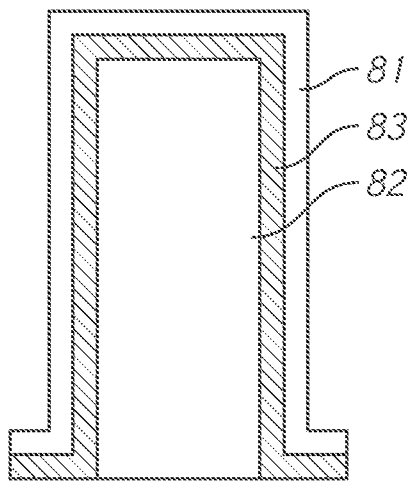
FIG. 8A is a diagram illustrating a vertical cross-sectional view of a schematic structure of a capacitor element according to an embodiment of the disclosure.
Figure 8B:
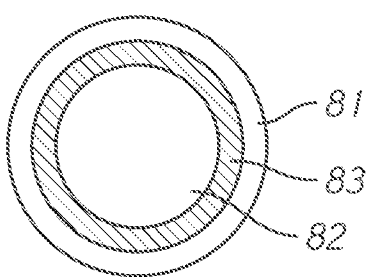
FIG. 8B is a diagram illustrating a horizontal cross-sectional view of the schematic structure of the capacitor element according to an embodiment of the disclosure.

FIG. 8A is a diagram illustrating a vertical cross-sectional view of a schematic structure of a capacitor element 80 according to an embodiment of the disclosure. FIG. 8B is a diagram illustrating a horizontal cross-sectional view of the schematic structure of the capacitor element 80 according to an embodiment of the disclosure. In some embodiments, the capacitor element 80 may be any of the capacitor elements of 31 in FIG. 3 or any of the capacitor elements 61A, 61B, 61'A and 61'B of FIG. 6.

The capacitor element 80 may include electrode layers 81 and 82 and an insulating layer 83 between the electrode layers 81 and 82. The electrode layer 81 may have a cylindrical shape with a hollow like an upside down cup.

The electrode layer 81 may have a top portion and a side portion on a top portion and a side portion of the insulating layer 83 respectively. In some embodiments, the top portion of the electrode layer 81 may be on the intermediate layer 35 of FIG. 3 or the intermediate layers 65A, 65B, and 65' of FIG. 6 in a manner that the electrode layer 81 may be coupled to the intermediate layer 35 of FIG. 3 or the intermediate layers 65A, 65B, and 65' of FIG. 6. The insulating layer 83 may have a cylindrical shape with a hollow like an upside down cup. The insulating layer 83 may have the top portion and the side portion between the electrode layers 81 and 82. The insulating layer 83 may insulate the electrode layer 81 from the electrode layer 82. The electrode layer 82 may have a pillar shape. The electrode layer 82 may have a top surface and a side surface on which the top portion and the side portion of the insulating layer 83 respectively are disposed. The electrode layer 82 may have a bottom surface not covered by the insulating layer 83. In some embodiments, the bottom surface of the electrode layer 82 may be on the conductive layer 34 (e.g., Conductive Layer 0) of FIG. 3 or the conductive layers 64A, 64B, 64'A and 64'B (e.g., Conductive Layer 0) of FIG. 6 in a manner that the electrode layer 82 may be coupled to the conductive layer 34 (e.g., Conductive Layer 0) of FIG. 3 or the conductive layers 64A, 64B, 64'A and 64'B (e.g., Conductive Layer 0) of FIG. 6.

In some embodiments, the electrode layers 81 and 82 may include, for example, titanium nitride (TiN). In some embodiments, the insulating layer 83 may include High-k material with a high relative permittivity. For example, the High-k material may include an oxidized material containing any one of, for example, yttrium (Y), titanium (Ti), zirconium (Zr)t hafnium (HQ, niobium (Nb), tantalum (Ta), and aluminum (Al). The insulating layer 83 may further include other elements such as silicon and nitrogen.

Figure 9A:
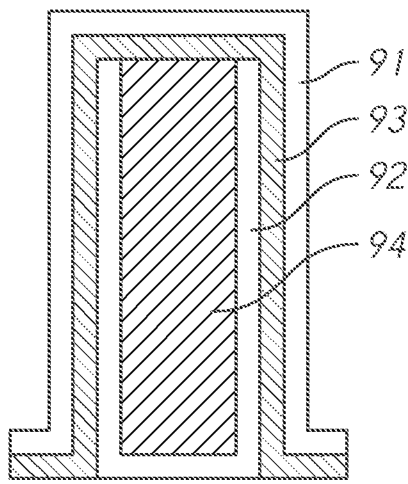
FIG. 9A is a diagram illustrating a vertical cross-sectional view of a schematic structure of a capacitor element according to an embodiment of the disclosure.
Figure 9B:
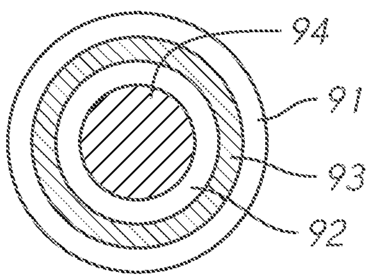
FIG. 9B is a diagram illustrating a horizontal cross-sectional view of the schematic structure of the capacitor element according to an embodiment of the disclosure.

FIG. 9A is a diagram illustrating a vertical cross-sectional view of a schematic structure of a capacitor element 90 according to an embodiment of the disclosure. FIG. 9B is a diagram illustrating a horizontal cross-sectional view of the schematic structure of the capacitor element 90 according to an embodiment of the disclosure. In some embodiments, the capacitor element 90 may be any of the capacitor elements of 31 in FIG. 3 or any of the capacitor elements 61A, 61B, 61'A and 61'B of FIG. 6.

The capacitor element 90 may include electrode layers 91 and 92 and an insulating layer 93 between the electrode layers 91 and 92. The electrode layer 91 may have a cylindrical shape with a hollow like an upside down cup. The electrode layer 91 may have a top portion and a side portion on a top portion and a side portion of the insulating layer 93 respectively. In some embodiments, the top portion of the electrode layer 91 may be on the intermediate layer 35 of FIG. 3 or the intermediate layers 65A, 65B, and 65' of FIG. 6 in a manner that the electrode layer 91 may be coupled to the intermediate layer 35 of FIG. 3 or the intermediate layers 65A, 65B, and 65' of FIG. 6. The insulating layer 93 may have a cylindrical shape with a hollow like an upside down cup. The insulating layer 93 may have the top portion on which the top portion of the electrode layer 91 is disposed and the side portion between the electrode layers 91 and 92. The electrode layer 92 may have a cylindrical shape with a hollow like an upright cup. The electrode layer 92 may have a side portion on the side portion of the insulating layer 93. The electrode layer 92 may have a bottom portion not covered by the insulating layer 93. In some embodiments, the bottom portion of the electrode layer 92 may be on the conductive layer 34 (e.g., Conductive Layer 0) of FIG. 3 or the conductive layers 64A, 64B, 64'A and 64'B (e.g., Conductive Layer 0) of FIG. 6 in a manner that the electrode layer 92 may be coupled to the conductive layer 34 (e.g., Conductive Layer 0) of FIG. 3 or the conductive layers 64A, 64B. 64'A and 64'B (e.g., Conductive Layer 0) of FIG. 6. The capacitor element 90 may further include a liner 94. The liner 94 may have a pillar shape. The liner 94 may cover an inner surface of the electrode layer 92. The top portion of the finer 94 may be covered with the top portion of the insulating layer 93.

In some embodiments, the electrode layers 91 and 92 may include, tor example, titanium nitride (TiN). In some embodiments, the insulating layer 93 may include High-k material with a high relative permittivity, for example, the High-k material may include an oxidized material containing any one of, for example, yttrium (Y), titanium (Ti), zirconium (Zr), hafnium (Hf), niobium (Nb), tantalum (Ta), and aluminum (Al). The insulating layer 93 may further include other elements such as silicon and nitrogen. The liner 94 may include conductive material, such as polycrystalline silicon.

Figure 10A:
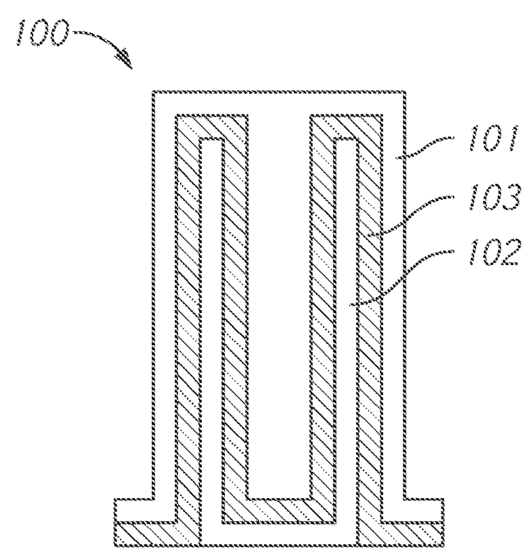
FIG. 10A is a diagram illustrating a vertical cross-sectional view of a schematic structure of a capacitor element according to an embodiment of the disclosure.
Figure 10B:
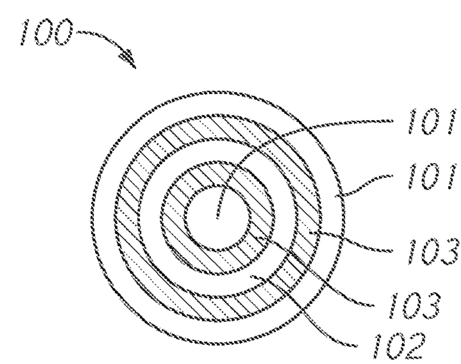
FIG. 10B is a diagram illustrating a horizontal cross-sectional view of the schematic structure of the capacitor element according to an embodiment of the disclosure.

FIG. 10A is a diagram illustrating a vertical cross-sectional view of a schematic structure of a capacitor element UK) according to an embodiment of the disclosure. FIG. 10B is a diagram illustrating a horizontal cross-sectional view of the schematic structure of the capacitor element 100 according to an embodiment of the disclosure. In some embodiments, the capacitor element 100 may be any of the capacitor elements of 31 in FIG. 3 or any of the capacitor elements 61A, 61B, 61' A and 61'B of FIG. 6.

The capacitor element 100 may include electrode layers 101 and 102 and an insulating layer 103 between the electrode layers 101 and 102. The electrode layer 102 may have a cylindrical shape with a hollow like an upright cup. The electrode layer 102 may have a side portion and a bottom portion. The side portion of the electrode layer 102 may have an inner surface and an outer surface covered with the insulating layer 103. The bottom portion of the electrode layer 102 may have an inner surface on its top covered with the insulating layer 103 and an outer surface rot covered by the insulating layer 103. In some embodiments, the outer surface of the electrode layer 102 may be on the conductive layer 34 (e.g., Conductive Layer 0) of FIG. 3 or the conductive layers 64A, 64B, 64'A and 64'B (e.g., Conductive Layer 0) of FIG. 6 in a manner that the electrode layer 82 may be coupled to the conductive layer 34 (e.g., Conductive Layer 0) of FIG. 3 or the conductive layers 64A, 64B, 64'A and 64'B (e.g., Conductive layer 0) of FIG. 6. As mentioned earlier, the insulating layer 103 may cover the inner and outer surfaces of the electrode layer 102. The electrode layer 101 may cover the insulating layer 103. For example, the electrode layer 101 may fill the hollow of the electrode layer 102 over the insulating layer 103. Thus, the electrode layer 101 may cover the inner and outer surface of the electrode layer 102 over the insulating layer 103, while the insulating layer 102 may insulate the electrode layer 101 from the electrode layer 102. The electrode layer 101 may have a top surface that may be on the intermediate layer 35 of FIG. 3 or the intermediate layers 65A, 65B, and 65' of FIG. 6 in a manner that the electrode layer 101 may be coupled to the intermediate layer 35 of FIG. 3 or the intermediate layers 65A, 65B, and 65' of FIG. 6.

In some embodiments, the electrode layers 101 and 102 may include, for example, titanium nitride (TiN). In some embodiments, the insulating layer 103 may include High-k material with a high relative permittivity. For example, the High-k material may include an oxidized material containing any one of, for example, yttrium (Y), titanium (Ti), zirconium (Zr), hafnium (Hf), niobium (Nb), tantalum (Ta), and aluminum (Al). The insulating layer 103 may further include other elements such as silicon and nitrogen.

Although various embodiments of the disclosure have been disclosed, it will be understood by those skilled in the art that the embodiments extend beyond the specifically disclosed embodiments to other alternative embodiments and/or uses and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying mode of the disclosed embodiments. Thus, it is intended that the scope of at least some of the present disclosure should not be limited by the particular disclosed embodiments described above.

What is claimed is:

1. An apparatus, comprising:

a first conductive layer including a power portion and an intermediate portion, the power portion being configured to provide a power supply voltage;

a second conductive layer;

a third conductive layer between the first conductive layer and the second conductive layer;

a contact between the first conductive layer and the third conductive layer, the contact including one end coupled to the intermediate portion of the first conductive layer and another end coupled to the third conductive layer; and one or more capacitor elements, wherein each capacitor element of the one or more capacitor elements includes one end coupled to the second conductive layer and another end coupled to the third conductive layer, wherein the power portion is included in a first power supply node, wherein the power supply voltage is the first power supply voltage, and wherein a voltage of the intermediate portion is an average of the first power supply voltage of the first power node and a second power supply voltage of a second power node, the second power node being different from the first power node.

2. The apparatus of claim 1, wherein the third conductive layer comprises polycrystalline silicon.

3. The apparatus of claim 1, wherein at least one capacitor element of the one or more capacitor elements comprises:

a first electrode layer including a top portion coupled to the third conductive layer;

a second electrode layer including a bottom portion coupled to the second conductive layer; and an insulating layer between the first and second electrode layers and configured to insulate the first electrode layer from the second electrode layer.

4. The apparatus of claim 3, wherein the first electrode layer comprises a cylindrical shape with a hollow and further comprises the top portion and a side portion, wherein the insulating layer comprises a top portion and a side portion on the top portion and the side portion of the first electrode layer, respectively.

5. The apparatus of claim 4, wherein the second electrode layer comprises a pillar shape including a top surface and a side surface on the top portion and the side portion of the insulating layer respectively, and further comprises a bottom surface on the second conductive layer.

6. An apparatus comprising:

a first conductive layer including a first power portion, a second power portion and first and second intermediate portions;

a second conductive layer including first and second portions;

a third conductive layer between the first conductive layer and the second conductive layer, and the third conductive layer including first and second portions coupled to the first and second intermediate portions of the first conductive layer respectively;

a first capacitor comprising:

one or more first capacitor elements including one end and another end, the one end being coupled to the first portion of the third conductive layer and the other end being coupled to the first portion of the second conductive layer;

a first power contact including one end coupled to the first portion of the second conductive layer and another end coupled to the first power portion of the first conductive layer; and a first contact including one end coupled to the first portion of the third conductive layer and another end coupled to the first intermediate portion of the first conductive layer; and a second capacitor comprising:

one or more second capacitor elements including one end and another end, the one end being coupled to the second portion of the third conductive layer and the other end being coupled to the second portion of the second conductive layer;

a second power contact including one end coupled to the second portion of the second conductive layer and another end coupled to the second power portion of the first conductive layer; and a second contact including one end coupled to the second portion of the third conductive layer and another end coupled to the second intermediate portion of the first conductive layer.

7. The apparatus of claim 6, further comprising an intermediate line in the first conductive layer, wherein the intermediate line is configured to couple the first intermediate portion to the second intermediate portion.

8. The apparatus of claim 6, wherein the first capacitor and the second capacitor comprise a constant capacitance.

9. The apparatus of claim 6, wherein the first capacitor and the second capacitor are separate from each other.

10. The apparatus of claim 6, wherein the first power portion is configured to provide a first power supply voltage and the second power portion is configured to provide a second power supply voltage that is different from the first power supply voltage.

11. The apparatus of claim 10, wherein a voltage of the intermediate line is an average of the first and second power supply voltages.

12. The apparatus of claim 10, wherein the first portion of the second conductive layer comprises one side and another side, and wherein each first capacitor element of the one or more first capacitor elements further comprises a plurality of first power contacts including the first power contact coupled to the first portion of the second conductive layer at the one side and another first power contact coupled to the first portion of the second conductive layer at the other side.

13. The apparatus of claim 6, wherein the third conductive layer further comprises a third portion, and wherein the apparatus further comprises a pair of capacitors comprising:

a third capacitor including:

one or more third capacitor elements including one end being coupled to the third portion of the third conductive layer and another end being coupled to the first power portion; and a fourth capacitor including:

one or more fourth capacitor elements including one end being coupled to the third portion of the third conductive layer and another end being coupled to the second power portion.

14. An apparatus, comprising:

a first capacitor coupled to a first power line;

a second capacitor coupled to a second power line;

an intermediate line configured to couple the first capacitor to the second capacitor, wherein the first and second power lines and the intermediate line are included in a first layer;

a first contact configured to couple a first node of the first capacitor to the first power line, the first node being included in a second layer;

a second contact configured to couple a second node of the first capacitor to the intermediate line, the second node being included in an intermediate layer between the first and second layers;

a third contact configured to couple a third node of the second capacitor to the second power line, the third node being included in the second layer; and a fourth contact configured to couple a fourth node of the second capacitor to the intermediate line, the fourth node being included in the intermediate layer.

15. The apparatus of claim 14, wherein the first capacitor is disposed in a first area and the second capacitor is disposed in a second area apart from the first area.

16. The apparatus of claim 15, further comprising:

a third capacitor and a fourth capacitor disposed in a third area, wherein the third and fourth capacitors are coupled to a fifth node in the intermediate layer, and wherein the first area is smaller than the third area.

17. The apparatus of claim 14, wherein a voltage of the intermediate line is an average of voltages of the first and second power lines.

18. The apparatus of claim 14, wherein at least one of the first capacitor or the second capacitor is a compensation capacitor configured to stabilize a power supply voltage from at least one of the first power line or the second power line.

* * * * *